United States Patent
Ha

(10) Patent No.: US 9,000,666 B2
(45) Date of Patent: Apr. 7, 2015

(54) FLAT PANEL DISPLAY DEVICE WITH A SHEET WITH A METAL LAYER IN BETWEEN A BASE SUBSTRATE AND AN ENCAPSULATION SUBSTRATE

(71) Applicant: Samsung Display Co., Ltd., Yongin, Gyeonggi-Do (KR)

(72) Inventor: Kuen-Dong Ha, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/737,126

(22) Filed: Jan. 9, 2013

(65) Prior Publication Data

US 2014/0097746 A1    Apr. 10, 2014

(30) Foreign Application Priority Data

Oct. 4, 2012  (KR) .................. 10-2012-0110096

(51) Int. Cl.
*H05B 33/04* (2006.01)
*H01L 51/52* (2006.01)

(52) U.S. Cl.
CPC ............ *H05B 33/04* (2013.01); *H01L 51/5237* (2013.01); *H01L 51/524* (2013.01); *H01L 51/5259* (2013.01)

(58) Field of Classification Search
CPC ... H01L 51/5237; H01L 51/524; H05B 33/04
USPC ........................................................ 313/512
See application file for complete search history.

(56) References Cited

U.S. PATENT DOCUMENTS

| | | | |
|---|---|---|---|
| 5,808,707 A * | 9/1998 | Niibori et al. | 349/60 |
| 5,962,962 A * | 10/1999 | Fujita et al. | 313/412 |
| 7,371,143 B2 | 5/2008 | Becken et al. | |
| 2002/0125822 A1 * | 9/2002 | Graff et al. | 313/506 |
| 2003/0117066 A1 * | 6/2003 | Silvernail | 313/504 |
| 2007/0170849 A1 * | 7/2007 | Park | 313/506 |
| 2008/0050585 A1 * | 2/2008 | Masuda et al. | 428/354 |
| 2009/0051272 A1 * | 2/2009 | Fukuda et al. | 313/504 |
| 2011/0127570 A1 | 6/2011 | Um et al. | |
| 2011/0291119 A1 | 12/2011 | Ryu et al. | |
| 2011/0310545 A1 * | 12/2011 | Liu | 361/679.01 |

FOREIGN PATENT DOCUMENTS

| | | |
|---|---|---|
| KR | 1999-0052907 | 7/1999 |
| KR | 10-2004-0039608 | 5/2004 |
| KR | 10-2009-0069891 | 7/2009 |
| KR | 10-0942118 | 2/2010 |
| KR | 10-2012-0056572 | 6/2012 |

OTHER PUBLICATIONS

U.S. Appl. No. 13/189,974.*

* cited by examiner

*Primary Examiner* — Anh Mai
*Assistant Examiner* — Steven Horikoshi
(74) *Attorney, Agent, or Firm* — Robert E. Bushnell, Esq.

(57) ABSTRACT

A flat panel display device to protect a display unit against an external shock. The flat panel display device includes a base substrate on which a display unit is formed, an encapsulation substrate combined to the base substrate to cover the display unit, and a metal sheet disposed in a space between the base substrate and the encapsulation substrate and adhered to the base substrate and the encapsulation substrate without a gap. The flat panel display device having such a structure is able to suppress an external shock from being directly transmitted to the display unit, thereby preventing the display unit, which is a key element, from being damaged by the external shock.

16 Claims, 3 Drawing Sheets

FLAT PANEL DISPLAY DEVICE WITH A SHEET WITH A METAL LAYER IN BETWEEN A BASE SUBSTRATE AND AN ENCAPSULATION SUBSTRATE

CLAIM PRIORITY

This application makes reference to, incorporates the same herein, and claims all benefits accruing under 35 U.S.C. §119 from an application earlier filed in the Korean Intellectual Property Office on 4 Oct. 2012 and there duly assigned Serial No. 10-2012-0110096.

BACKGROUND OF THE INVENTION

1. Field of the Invention

The present invention generally relates to a flat panel display device.

2. Description of the Related Art

Since a flat panel display device, such as an organic light-emitting display device, may be thinned according to driving characteristics, extensive research has have been actively performed on the flat panel display device.

The above information disclosed in this Related Art section is only for enhancement of understanding of the background of the invention and therefore it may contain information that does not form the prior art that is already known to a person of ordinary skill in the art.

SUMMARY OF THE INVENTION

The present invention provides a flat panel display device wherein damage to a display unit due to an external shock is suppressed.

According to an aspect of the present invention, there is provided a flat panel display device including: a base substrate on which a display unit is formed; an encapsulation substrate combined to the base substrate to cover the display unit; and a metal sheet disposed in a space between the base substrate and the encapsulation substrate and adhered to the base and encapsulation substrates without a gap.

The metal sheet may include a metal thin plate and a polyethylene terephthalate (PET) film adhered to the metal thin plate.

The PET film may be adhered to one surface of the metal thin plate. The PET film may be adhered to both surfaces of the metal thin plate.

The metal thin plate may include aluminum.

A thickness of the metal thin plate may be from about 20 µm to about 40 µm.

An adhesive film may be disposed between the metal sheet and the encapsulation substrate and between the metal sheet and the base substrate.

The flat panel display device may further include a liquefied getter for moisture absorption between the metal sheet and the base substrate.

The base substrate and the encapsulation substrate may be formed of glass.

A bracket assembly may be combined to a substrate opposite to a surface where an image of the display unit is realized, from among the base substrate and the encapsulation substrate.

The image of the display unit may be realized towards the base substrate and the bracket assembly may be combined to the encapsulation substrate.

The bracket assembly may include a frame combined to an edge of the encapsulation substrate, and a bracket body facing a center portion of the encapsulation substrate by being supported by the frame, and a gap of at least 1 mm may be formed between the bracket body and the encapsulation substrate.

An adhesive tape may be disposed between the frame and the edge of the encapsulation substrate, and a size of the gap between the bracket body and the encapsulation substrate may be determined based on a thickness of the adhesive tape.

A cushioning material may be filled in the gap. The cushioning material may include any one of expanded urethane and phorone tape.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
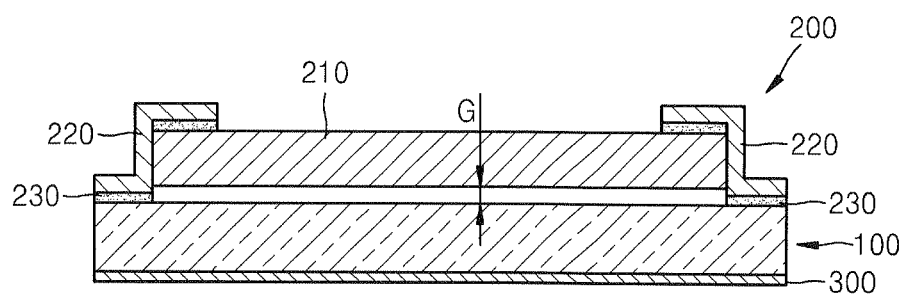
FIG. 1 is a diagram of a flat panel display device according to an embodiment of the present invention.

Hereinafter, one or more exemplary embodiments of the present invention will be described in detail with reference accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An organic light-emitting display device may include a base substrate on which a display unit including a thin film transistor and a light-emitting display device is formed, and an encapsulation substrate sealing and protecting the display unit by being combined to the base substrate. In other words, the encapsulation substrate is placed on the base substrate on which the display unit is formed, and then the encapsulation substrate and the base substrate are sealed by using a sealant so as to protect the display unit from moisture or oxygen.

However, the display unit of the flat panel display device may be easily damaged by an external shock has become an issue, and thus measures against this issue are addressed in this application. In other words, generally, after the flat panel display device is manufactured, the display unit is tested by colliding a steel ball against a light-emitting substrate from among the base substrate and the encapsulation substrate to observe a degree of damage. Here, the display unit of the flat panel display device having a general structure is badly damaged during the test, and thus remedial measures are urgently required.

FIG. 1 is a diagram of a flat panel display device according to an embodiment of the present invention.

The flat panel display device according to the current embodiment includes a panel 100 and a bracket assembly 200 supporting the panel 100. The bracket assembly 200 includes a frame 220 combined to an edge of the panel 100 through an adhesive tape 230, and a bracket body 210 supported by the frame 220.

Figure 2:
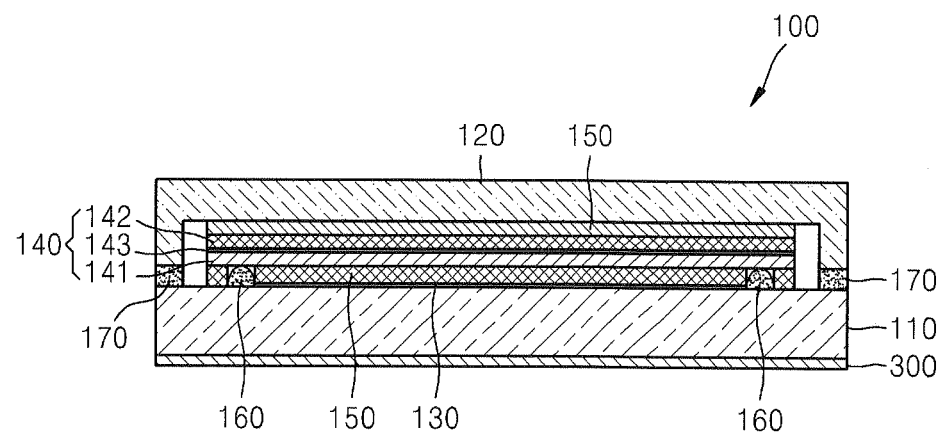
FIG. 2 is a cross-sectional view illustrating in detail a panel of the flat panel display device of FIG. 1, according to an embodiment of the present invention.

The panel 100 realizes an image towards a surface where a polarizing plate 300 may be adhered, and a detailed structure of the panel 100 is shown in FIG. 2.

In other words, as shown in FIG. 2, the panel 100 includes a base substrate 110 on which a display unit 130 may be formed, and an encapsulation substrate 120 combined to the base substrate 110 through a sealant 170 so as to cover and protect the display unit 130.

Here, the display unit 130 may include a thin film transistor and a light-emitting unit connected to the thin film transistor, which are simply called the display unit 130 herein.

The encapsulation substrate 120 covers the display unit 130 so that external moisture or the like does not penetrate into the display unit 130. Like the base substrate 110, the encapsulation substrate 120 may be formed of glass.

The sealant 170 may be formed of a material that may be hardened via laser beam exposure, such as a frit, or hardened when ultraviolet light is irradiated, such as an ultraviolet ray hardening resin. Accordingly, when the sealant 170 may be coated between the base substrate 110 and the encapsulation substrate 120 and laser beam or ultraviolet light may be irradiated on a corresponding region, the sealant 170 may be hardened, thereby strongly sealing the base substrate 110 and the encapsulation substrate 120.

Also, a metal sheet 140 adhered to inner walls of the base and encapsulation substrates 110 and 120 may be provided in an inner space formed as the base and encapsulation substrates 110 and 120 are combined to each other. The metal sheet 140 includes a metal thin plate 141 formed of aluminum, and a polyethylene terephthalate (PET) film 142 adhered to one surface of the metal thin plate 141 through an adhesive layer 143. As shown in FIG. 2, the metal sheet 140 may be adhered to the inner walls of the base and encapsulation substrates 110 and 120 without a gap through an adhesive film 150. When an external shock is applied to any one of the base and encapsulation substrates 110 and 120, the metal sheet 140 quickly transmits the external shock to the other. In the current embodiment, since an image is realized towards the base substrate 110 to which the polarizing plate 300 is adhered, and a surface of the base substrate 110 is externally exposed as shown in FIG. 1, the external shock may be mostly applied to the base substrate 110, and a steel ball collision test is performed on the base substrate 110 during an actual manufacturing process. Accordingly, when the steel ball collision test is performed, a steel ball is dropped on the base substrate 110 to observe a collision result. Here, if there is a space between the base and encapsulation substrates 110 and 120 without the metal sheet 140, a shock applied to the base substrate 110 is not quickly transmitted to the encapsulation substrate 120 on the opposite side of the base substrate 110, and thus the shock is directly spread to the display unit 130. At this time, the thin film transistor or the light-emitting unit in each pixel of the display unit 130 may be damaged due to the shock, and as a result, a function for realizing an image may be seriously damaged. Also, even when the space between the base and encapsulation substrates 110 and 120 may be filled with a moisture absorbent instead of the metal sheet 140, the shock may not be quickly transmitted, and thus it is highly likely for the display unit 130 to absorb most of the shock.

However, when the metal sheet 140, including the metal thin plate 141, may be thoroughly adhered to the base and encapsulation substrates 110 and 120 without a gap according to the current embodiment, a shock applied to the base substrate 110 may be quickly transmitted to the encapsulation substrate 120 through the metal sheet 140 before being spread to the display unit 130. At this time, a slight crack may be generated in the encapsulation substrate 120, but the display unit 130 is safe, and thus the original function of the flat panel display device for realizing an image may be safely protected. A reference numeral 160 denotes a liquefied getter for moisture absorption.

The flat panel display device having such a structure may be manufactured as follows:

First, the base substrate 110, formed of glass and including the display unit 130, is prepared, the adhesive film 150 and the liquefied getter 160 are formed on the base substrate 110, and then the metal sheet 140 may be adhered thereto. Here, the metal thin plate 141 of the metal sheet 140 may be formed of aluminum and have a thickness from about 20 μm to about 40 μm. When the thickness is lower than about 20 μm, a shock transmitting capability may be low and when the thickness is higher than about 40 μm, it may be difficult to thin the flat panel display device. Thus, the thickness is from about 20 μm to about 40 μm. Also, the PET film 142 flattens the metal thin plate 141 so that the metal thin plate 141 is not uneven.

After adhering the metal sheet 140, the adhesive film 150 may be adhered thereto and then the encapsulation substrate 120 also formed of glass may be combined to the base substrate 110 by using the sealant 170. As such, the base and encapsulation substrates 110 and 120 are adhered to each other without a gap by providing the metal sheet 140 in an inner space between the base and encapsulation substrates 110 and 120, as shown in FIG. 2.

Next, as shown in FIG. 1, the bracket assembly 200 described above is provided to the encapsulation substrate 120 of the panel 100. Here, a gap G may be formed between a center portion of the encapsulation substrate 120 and the bracket body 210, and a space of the gap G may be equal to or higher than 1 mm. When the space of the gap G is sufficient, the panel 100 easily absorbs an external shock, but when there is no gap G or the space of the gap G is too small, the encapsulation substrate 120 may shake due to the external shock and bump into the bracket body 210, thereby causing a secondary shock. Accordingly, the space of the gap G may be at least 1 mm. The gap G may be obtained by adjusting a thickness of the adhesive tape 230 of the frame 220.

Figure 5:
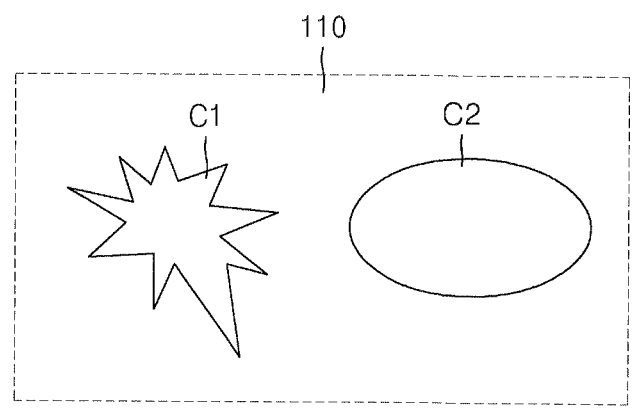
FIG. 5 is a diagram for describing a shape of a shock crack shown when a steel ball collision test is performed on the flat panel display device of FIG. 1.

When a steel ball collision test is performed on the flat panel display device manufactured as such, the metal sheet 140 quickly transmits a shock applied to the base substrate 110 to the encapsulation substrate 120, and thus the display unit 130 may be safely protected from damage Here, a result of the steel ball collision test may be determined by looking at a shape of a collision crack. In other words, when the collision crack shown through the base substrate 110 has a shape of a star crack C1, as shown in FIG. 5, the shock has transmitted well to the encapsulation substrate 120. However, when the collision crack has a shape of a circle crack C2, as shown in FIG. 5, the shock has not transmitted well to the encapsulation substrate 120 and thus most of the shock may be absorbed by the display unit 130.

When an actual steel ball collision test was performed, the circle crack C2 started to show when a steel ball was dropped only from a height of 25 cm in a general flat panel display device without the metal sheet 140, but when the metal sheet 140 was provided like the current embodiment, the circle crack C2 was not formed until a height of 75 cm.

Accordingly, by using the structure of the current embodiment, the display unit 130 may be very safely protected from an external shock, and thus a flat panel display device having a remarkably improved shock resistance performance may be realized.

Figure 3:
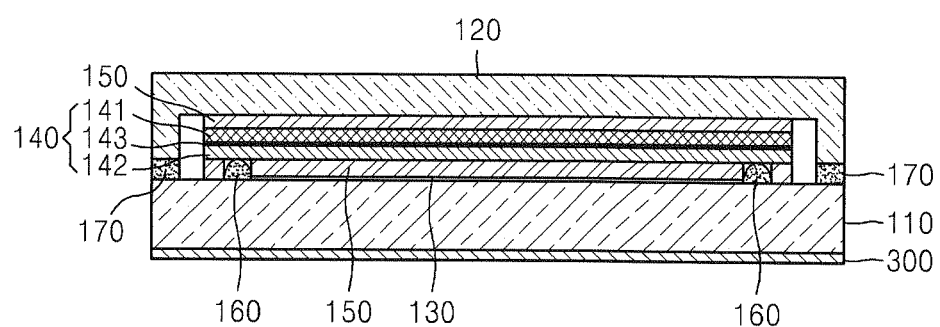
FIG. 3 is a cross-sectional view illustrating in detail a panel of the flat panel display device of FIG. 1, according to another embodiment of the present invention.
Figure 4:
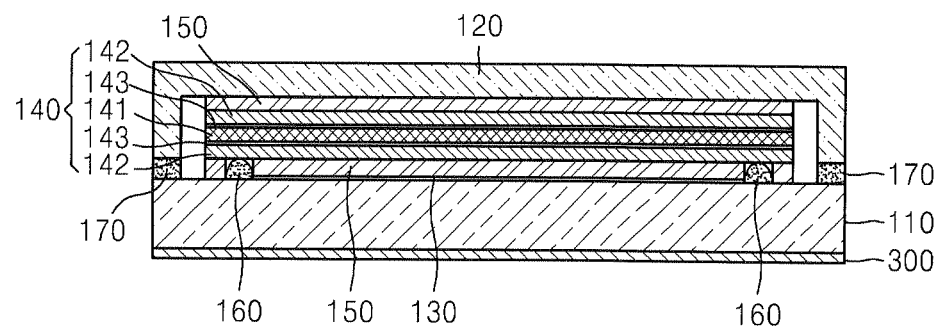
FIG. 4 is a cross-sectional view illustrating in detail a panel of the flat panel display device of FIG. 1, according to another embodiment of the present invention.

In the embodiment described above, the PET film 142 for flattening the metal thin plate 141 may be only adhered to the surface of the metal thin plate 141 facing the encapsulation substrate 120, but alternatively, the PET film 142 may be adhered to the other surface of the metal thin plate 141 facing the base substrate 110, as shown in FIG. 3 or may be adhered to both surfaces of the metal thin plate 141, as shown in FIG. 4. In any case, the external shock may be suppressed from being spread to the display unit 130 and thus a shock resistance performance may be obtained as long as the metal sheet 140 is thoroughly adhered to the base and encapsulation substrates 110 and 120 without a gap.

Figure 6:
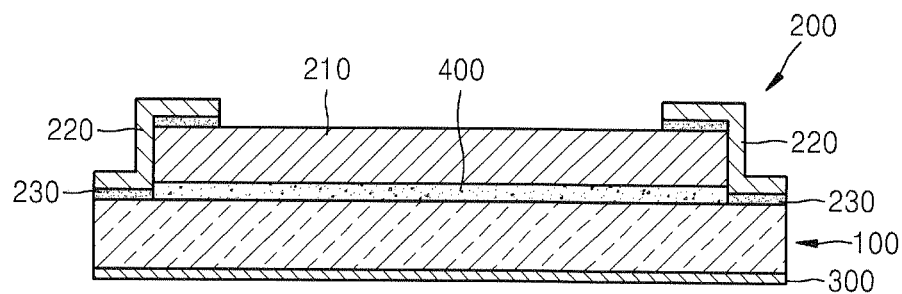
FIG. 6 is a modified example of the flat panel display device of FIG. 1.

Also in FIG. 1, there may be a gap G of at least 1 mm between the center portion of the encapsulation substrate 120 and the bracket body 210, but alternatively, as shown in FIG. 6, the gap G may be filled with a cushioning material 400, such as expanded urethane or phorone tape.

Accordingly, by using the flat panel display device described above, an external shock applied to the flat panel display device may be suppressed from being directly transmitted to the display unit, and thus the display unit, which is a key element, may be prevented from being damaged by the external shock, thereby increasing a reliability of the flat panel display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display device, comprising:
   a base substrate on which a display unit is formed;
   an encapsulation substrate combined to the base substrate to cover the display unit;
   a sheet having a metal thin plate and a polyethylene terephthalate (PET) film adhered to the metal thin plate disposed in a space between the base substrate and the encapsulation substrate and the metal thin plate adhered to the base substrate and the PET film adhered to the encapsulation substrate with no gap between the metal thin plate and the base substrate and no gap between the PET film and the encapsulation substrate;
   a liquefied getter for moisture absorption between the sheet and the base substrate; and
   an adhesive film is disposed between the sheet and the encapsulation substrate and between the sheet and the base substrate.

2. The flat panel display device of claim 1, wherein the PET film is adhered to one surface of the metal thin plate.

3. The flat panel display device of claim 1, wherein the PET film is adhered to both surfaces of the metal thin plate.

4. The flat panel display device of claim 1, wherein the metal thin plate comprises aluminum.

5. The flat panel display device of claim 1, wherein a thickness of the metal thin plate is from about 20 μm to about 40 μm.

6. The flat panel display device of claim 1, wherein the base substrate and the encapsulation substrate are formed of glass.

7. The flat panel display device of claim 1, wherein a bracket assembly is combined to a substrate opposite to a surface where an image of the display unit is realized, from among the base substrate and the encapsulation substrate.

8. The flat panel display device of claim 7, wherein the image of the display unit is realized towards the base substrate and the bracket assembly is combined to the encapsulation substrate.

9. The flat panel display device of claim 8, wherein the bracket assembly comprises:
a frame combined to an edge of the encapsulation substrate, and a bracket body facing a center portion of the encapsulation substrate by being supported by the frame, and
a gap of at least 1 mm is formed between the bracket body and the encapsulation substrate.

10. The flat panel display device of claim 9, wherein an adhesive tape is disposed between the frame and the edge of the encapsulation substrate, and a size of the gap between the bracket body and the encapsulation substrate is determined based on a thickness of the adhesive tape.

11. The flat panel display device of claim 9, wherein a cushioning material is filled in the gap.

12. The flat panel display device of claim 11, wherein the cushioning material comprises any one of expanded urethane and phorone tape.

13. A flat panel display device, comprising:
a base substrate;
a display unit directly affixed to the base substrate;
an adhesive film in direct contact with and entirely covering the display unit;
a sheet having a metal thin plate composed of aluminum and a polyethylene terephthalate (PET) film affixed to one surface of the metal thin plate using an adhesive layer to attach the PET film to the metal thin plate, said sheet firmly affixed to the base substrate;
a liquefied getter for moisture absorption between the sheet and the base substrate;
an encapsulation substrate affixed to the base substrate and entirely covering the PET film; and
an adhesive film is disposed between the sheet and the encapsulation substrate and between the sheet and the base substrate,
wherein no gaps or voids exist between the encapsulation substrate and the PET film, the metal thin plate, and the adhesive film and the display unit.

14. The flat panel display device recited in claim 13, wherein said metal thin plate has a thickness range of between 20 $\mu$m and 40 $\mu$m.

15. The flat panel display device recited in claim 14, wherein the base substrate and the encapsulation substrate are composed of glass.

16. The flat panel display device recited in claim 15, further comprising:
a bracket assembly having a frame combined to an edge of the encapsulation substrate, and a bracket body facing a center portion of the encapsulation substrate that is supported by the frame,
wherein a cavity of at least 1 mm is formed between the bracket body and the encapsulation substrate.

* * * * *